(12) United States Patent
Goriaux et al.

(10) Patent No.: US 8,422,234 B2
(45) Date of Patent: Apr. 16, 2013

(54) DEVICE FOR ELECTROMAGNETIC SHIELDING AND DISSIPATION OF HEAT RELEASED BY AN ELECTRONIC COMPONENT, AND CORRESPONDING ELECTRONIC CIRCUIT

(75) Inventors: Jacques Goriaux, Versailles (FR); Alain Bironneau, La Varenne (FR); Jean-Pierre Mauclerc, Montrouge (FR)

(73) Assignee: Sierra Wireless, Issy-les-Moulineaux (FR)

( * ) Notice: Subject to any disclaimer, the term of this patent is extended or adjusted under 35 U.S.C. 154(b) by 168 days.

(21) Appl. No.: 13/056,833

(22) PCT Filed: Jun. 19, 2009

(86) PCT No.: PCT/EP2009/057680
§ 371 (c)(1),
(2), (4) Date: Apr. 21, 2011

(87) PCT Pub. No.: WO2010/012543
PCT Pub. Date: Feb. 4, 2010

(65) Prior Publication Data
US 2011/0194259 A1    Aug. 11, 2011

(30) Foreign Application Priority Data
Jul. 31, 2008    (FR) .................................... 08 55285

(51) Int. Cl.
*H05K 7/20*    (2006.01)
(52) U.S. Cl.
USPC ........... 361/720; 361/704; 361/707; 361/719; 361/679.46; 361/679.54; 361/800; 361/816; 361/818; 165/80.3; 165/104.33; 165/185; 174/252; 174/350
(58) Field of Classification Search ............... 361/679.46–679.54, 704–724, 361/800, 801, 802, 816, 818, 732, 760–767; 165/80.2–80.5, 104.33, 185; 174/15.1, 16.3, 174/252, 350–359; 257/668, 698, 706–727, 257/798
See application file for complete search history.

(56) References Cited

U.S. PATENT DOCUMENTS
5,367,434 A * 11/1994 Griffin et al. ................. 361/719
5,581,443 A    12/1996 Nakamura et al.
(Continued)

FOREIGN PATENT DOCUMENTS
DE    19859739 A1    7/2000
EP    0519767 A2    12/1992

OTHER PUBLICATIONS
French Search Report dated Mar. 26, 2009 for corresponding French Application No. 0855285, filed Jul. 31, 2008.
(Continued)

*Primary Examiner* — Michail V Datskovskiy
(74) *Attorney, Agent, or Firm* — David D. Brush; Westman, Champlin & Kelly, P.A.

(57) ABSTRACT

A device is provided for electromagnetic shielding an electronic component and for dissipating heat generated by the component. The component includes a package designed to be fastened to a first face of a printed circuit, called a rear face, by a heat sink, the heat sink passing through the rear face of the printed circuit and emerging on a second face of the printed circuit, called a front face. The device includes a metal structure mounted on the front face of the printed circuit and defining an electromagnetic shielding enclosure. The metal structure having a first heat discharge opening lying approximately opposite the heat sink. The device further includes at least one thermal connector, a first end of which is fastened to the metal structure and a second end of which is fastened to the heat sink and/or to the front face of the printed circuit near the heat sink.

12 Claims, 5 Drawing Sheets

U.S. PATENT DOCUMENTS

| | | | | |
|---|---|---|---|---|
| 6,195,244 B1 * | 2/2001 | Barz | ............................ | 361/111 |
| 6,215,180 B1 * | 4/2001 | Chen et al. | .................... | 257/720 |
| 6,310,773 B1 * | 10/2001 | Yusuf et al. | .................... | 361/704 |
| 6,490,161 B1 * | 12/2002 | Johnson | ........................ | 361/704 |
| 6,809,931 B2 * | 10/2004 | Dove et al. | .................... | 361/707 |
| 7,232,332 B2 * | 6/2007 | Osborn et al. | ................ | 439/487 |
| 7,411,278 B2 * | 8/2008 | Wen et al. | .................... | 257/659 |
| 7,623,360 B2 * | 11/2009 | English et al. | ................ | 361/816 |
| 2004/0080917 A1 | 4/2004 | Steddom et al. | | |

OTHER PUBLICATIONS

English Translation of Written Opinion dated Mar. 1, 2011 for corresponding International Application No. PCT/EP2009/057680, filed Jun. 19, 2009.

International Search Report dated Nov. 6, 2009 for corresponding International Application No. PCT/EP2009/057680, filed Jun. 19, 2009.

* cited by examiner

DEVICE FOR ELECTROMAGNETIC SHIELDING AND DISSIPATION OF HEAT RELEASED BY AN ELECTRONIC COMPONENT, AND CORRESPONDING ELECTRONIC CIRCUIT

CROSS-REFERENCE TO RELATED APPLICATIONS

This Application is a Section 371 National Stage Application of International Application No. PCT/EP2009/057680, filed Jun. 19, 2009 and published as WO 2010/012543 on Feb. 4, 2010, not in English.

STATEMENT REGARDING FEDERALLY SPONSORED RESEARCH OR DEVELOPMENT

None.

THE NAMES OF PARTIES TO A JOINT RESEARCH AGREEMENT

None.

FIELD OF THE DISCLOSURE

The field of the disclosure is that of electronic circuits and more particularly circuits including power electronic components.

More specifically, the disclosure pertains to techniques for shielding and dissipating the heat released by such components.

The disclosure can be applied especially in the field of radio communications, where the radio communications devices implement power amplifiers that give off substantial quantities of heat.

Thus, the disclosure can be applied especially but not exclusively to the power amplifiers used by third generation (3G) radio communications devices.

BACKGROUND OF THE DISCLOSURE

Here below, we discuss the drawbacks of the prior art through the special case of the power amplifiers used by radio communications devices, for example radio telephones or PDAs (Personal Digital Assistants).

When designing a radio communications device, it is sought especially to reconcile at least some of the following goals:
  the security of the device and especially checks on the electromagnetic compatibility (EMC) of the power amplifier. According to a commonly accepted definition, the term "electromagnetic compatibility" is understood to mean the capacity of a piece of hardware or a system to work in its electromagnetic environment satisfactorily and without itself producing electromagnetic disturbances that would be intolerable for anybody situated in this environment;
  the efficiency of the heat control, the temperature of the power amplifier which must be as low as possible so as to improve the temperature behavior and increase the life span of the device;
  the compactness of the device since the surface area of the printed circuit used by each of the components of the device must be as small as possible;
  simplicity and low cost of manufacture.

FIG. 1 illustrates an electronic circuit 100 of a second-generation (2G) radio communications device. The circuit 100 has a shielding 11 which can take the form of a metal pan entirely covering the front face 1 of the printed circuit 12 on which the different components are implanted (for example the radio communications module, the power amplifier or amplifiers etc). In the prior art, such a screen 11 is essentially designed to prevent the energy radiated by the power amplifier or amplifiers from going out of the device (in the form of harmonics conveyed by electromagnetic radiation) and from disturbing the other functional blocks of the device or other neighboring apparatuses.

The second generation (2G) radio communications devices generally use high-efficiency non-linear power amplifiers.

FIG. 2 is a partial schematic view in cross-section of the electronic circuit 100 of FIG. 1. In this example, the power amplifier 200 is mounted on a rear face 2 of the printed circuit 12. The power amplifier 200 includes amplifier means 21 encapsulated in a package 22 made out of molded plastic. The package 22 has a metal sole 23 comprising a first face designed to receive the amplifier means 21 and a second face designed to be fixedly joined to the rear face 2 of the printed circuit 12. Conventionally, the package 22 of the amplifier 200 (high-efficiency non-linear power amplifier) is used, on its own, to release a large part of the heat released by the amplifier means 21. This heat C1 is therefore radiated on the rear face 2 of the printed circuit 12.

As illustrated in FIG. 3, a heat sink 31 can be used to obtain better thermal dissipation. Indeed, the heat sink 31 is used to collect a part of the heat released by the amplifier means 21 through the metal sole 23 and then convey and radiate this collected heat C2 on the front face 1 side of the printed circuit 12.

In the example illustrated, the heat sink 31 has a metal base 311 designed to be fixedly joined to the metal sole 23 and two metal arms 213 and 313 that extend perpendicularly to the base 311 and are designed to get engaged in the printed circuit 12. Each of the metal arms 312 and 313 goes through the rear face 2 of the printed circuit 12 and emerges on the front face 1 of the printed circuit 12. Thus the metal base 311 is used to collect a part of the heat released by the amplifier means 21 and the metal arms 312 and 313 enable this collected heat C2 to be discharged on the front face 1 side of the printed circuit 12 through the copper-plated part of the front face 1 of the printed circuit 12.

Third-generation (3G) radio communications devices generally use low-efficiency linear power amplifiers.

At present, the classic techniques (described here above with reference to FIGS. 1 to 3) for heat dissipation in 2G power amplifiers are applied to 3G power amplifiers.

The inventors have noted that the classic techniques mentioned here above are not suited to 3G power amplifiers because the increase in temperature with the output power of the 2G power amplifiers is far from that of the 3G power amplifiers. In other words, the classic techniques mentioned here above cannot be used to adequately and speedily dissipate the heat released by the 3G power amplifiers.

Furthermore, although heat sinks improve thermal dissipation by discharging a part of the heat produced by the power amplifier on the front face side of the printed circuit, there is nevertheless a risk of a glasshouse effect. Indeed, the shielding prevents the discharge of the heat conducted by the heat sinks towards the exterior of the printed circuit (i.e. out of the shielding). This heat C2 is therefore confined to the zone defined between the screen and the front face of the printed circuit.

There is therefore a need to optimize the thermal control of the 3G power amplifiers, especially to maximize the temperature behavior and life span of the radio communications device.

SUMMARY

One particular embodiment of the invention proposes a device for electromagnetic shielding and for dissipating the heat released by an electronic component, said component comprising a package designed to be fixedly joined to a first face of a printed circuit, called a rear face, by means of a heat sink, said going through the rear face of the printed circuit and emerging on a second face of the printed circuit, called a front face.

According to an embodiment of the invention, the device comprises a metal structure or metalized structure mounted on the front face of the printed circuit and defining an electromagnetic shielding enclosure, said metal structure comprising a first heat-discharging aperture extending appreciably so as to be facing said heat sink. The device has at least one thermal connector, having a first end fixedly joined to said metal structure and a second end fixedly joined to said heat sink and/or to the front face of the printed circuit in the vicinity of said heat sink.

Thus, an embodiment of the invention proposes a structure providing both the "shielding" function and the "thermal radiator" function. The structure of an embodiment of the invention enables the heat released at the heat sink of the component to be discharged out of the printed circuit. More specifically, the heat is discharged by convection and by radiation. Indeed, the structure of an embodiment of the invention includes a hot-air discharging aperture that facilitates exchanges of air between the front face of the printed circuit and the exterior of the printed circuit. In one preferred embodiment, the aperture extends so as to be facing the heat sink. Naturally, in another embodiment, it can be envisaged that the aperture does not fully face the heat sink. Thus, a part of the heat transmitted by the heat sink to the copper-plated part of the front face of the printed circuit is dissipated through the aperture by natural convection. Furthermore, the structure of an embodiment of the invention comprises one or more connectors forming a thermal link between the heat sink of the component and the structure. The connector or connectors of an embodiment of the invention therefore enable a part of the heat released by the heat sink to be collected and conveyed to the structure which then takes charge of dissipating it out of the printed circuit. Thus, an embodiment of the invention proposes the use of all or part of the surface of the structure to discharge the heat of the heat sink by radiation and convection. As shall be seen here below, certain connectors can coincide with the walls of the structure. An embodiment of the invention thus improves the cooling of the electronic component and therefore its temperature behavior and its life span.

Advantageously, the device includes an element forming a channel for discharging heat from said heat sink to said first aperture.

Thus, an embodiment of the invention provides a system for guiding the heat released by the heat sink to the aperture. The element forming the discharge channel therefore maximizes the convection phenomenon.

Advantageously, said element forming a discharge channel includes said connector or at least one of a plurality of connectors.

In one particular embodiment, the connector is a tube, the first end of which is designed to get engaged in the aperture and a second end of which is fixedly joined to the heat sink.

In another particular embodiment, a set of connectors is distributed around the heat sink, each connector forming a part of the discharge channel.

Advantageously, each connector is made out of a metallic material.

The connectors have high thermal conductivity. Thus, an efficient thermal link is obtained between the heat sink of the component and the structure.

According to an advantageous aspect of an embodiment of the invention, said structure comprises at least one second aperture situated in the vicinity of said first aperture.

Thus, an embodiment of the invention proposes to maximize the cooling of the component. Indeed, the second aperture augments not only the radiation potential of the structure but also its convection potential because the second apertures can communicate with one another and with the first aperture.

Advantageously, the component is a power amplifier.

Thus an embodiment of the invention is especially well suited to the power amplifiers used by 2G or 3G radio communications devices.

In another embodiment, the invention pertains to an electronic circuit comprising a device for electromagnetic shielding and heat dissipation as described here above.

BRIEF DESCRIPTION OF THE DRAWINGS

Other features and advantages shall appear more clearly from the following description of a preferred embodiment, given by way of a simple illustrative and non-restrictive example, and from the appended drawings, of which.

DETAILED DESCRIPTION OF ILLUSTRATIVE EMBODIMENTS

The general principle of an embodiment of the invention relies on the use of the screen of an electronic circuit to dissipate the heat released by one or more electronic components of the circuit.

As shall be noted, in all the figures of the present document, identical elements are designated by a same numerical reference.

For the sake of simplification, the description shall be limited, throughout the rest of this document, to the special case of an assembly diagram where the electronic component, for example a 2G or 3G power amplifier, is mounted in the vicinity of one of the ends of the printed circuit. Those skilled in the art will extend this teaching without difficulty to any other assembly diagram (for example a diagram with one or more power amplifiers mounted at the center of the printed circuit).

Figure 1:
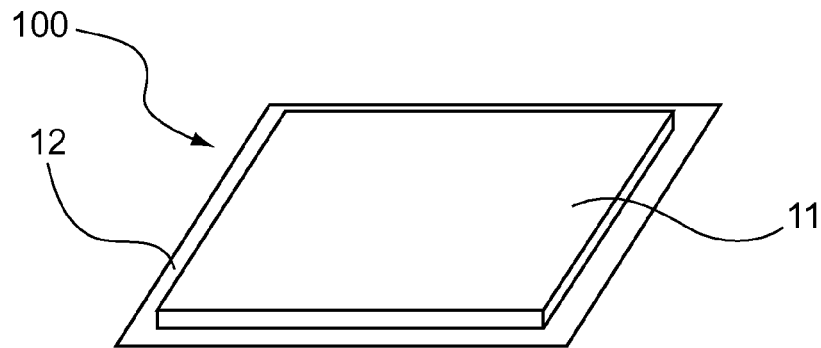
FIG. 1, already commented upon with reference to the prior art, presents an electronic circuit of a radio communications device.
Figure 2:
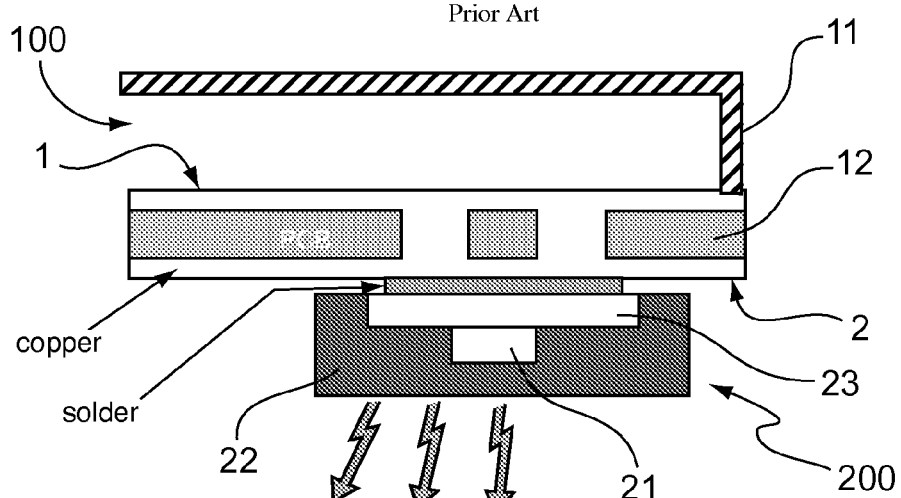
FIG. 2, also commented upon with reference to the prior art, presents a partial schematic cross-section of the electronic circuit of FIG. 1.
Figure 3:
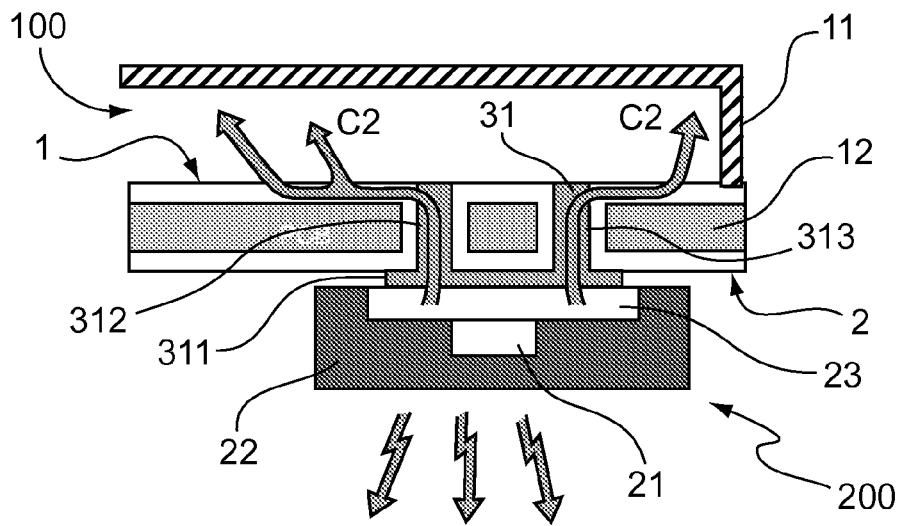
FIG. 3, also commented upon with reference to the prior art, provides a schematic view of a heat sink used by the amplifier of FIG. 2.
Figure 4:
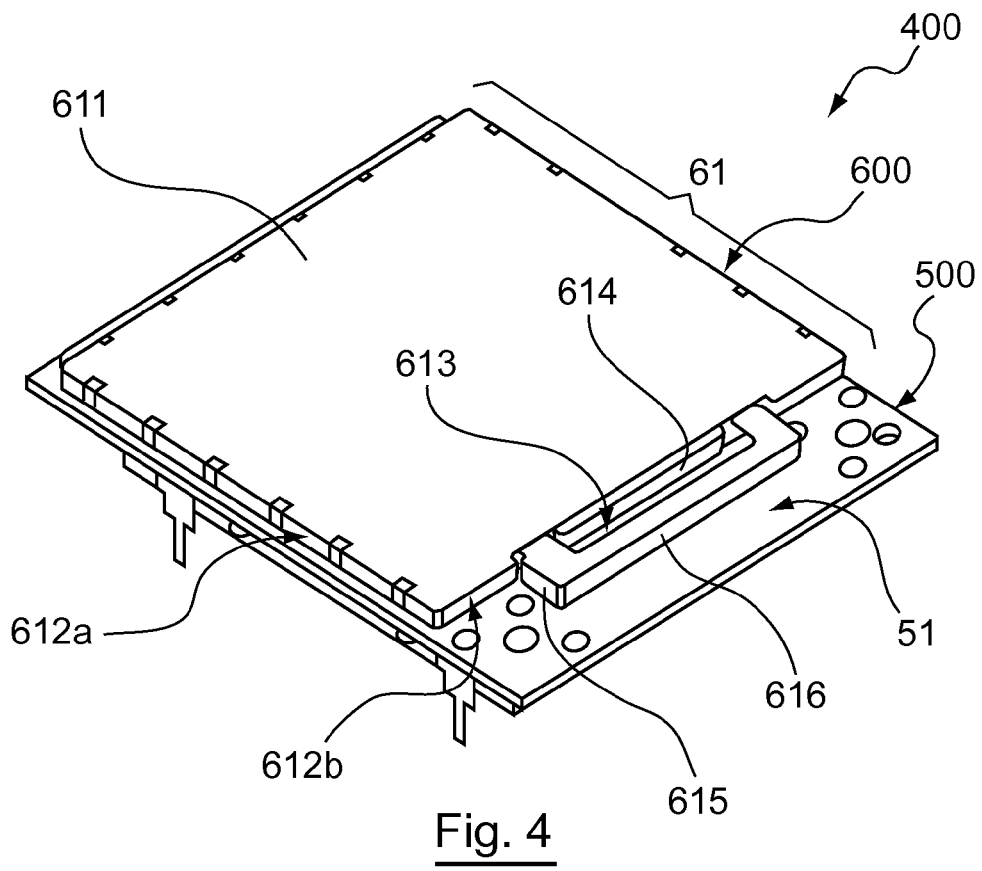
FIG. 4 illustrates an electronic circuit comprising a device for electromagnetic shielding and heat dissipation according to a particular embodiment of the invention.

FIG. 4 illustrates an electronic circuit 400 comprising a printed circuit 500 on which there is mounted a device 600 for electromagnetic shielding and heat dissipation according to an embodiment of the invention.

The device 600 of an embodiment of the invention comprises a metal structure 61 mounted on the front face 51 of the printed circuit 500, defining a shielded enclosure. In another embodiment, the structure 61 is constituted by an alloy with high thermal conductivity.

The metal structure 61 has a metal plate 611 forming a roof for the shielded enclosure and metal walls 612a and 612b designed to be fixedly joined to the printed circuit 500. The metal walls are for example soldered to the printed circuit 500.

The metal plate 611 has an aperture 613 (here below also called a first heat-discharge aperture) that opens entirely onto the heat sink 72 of the power amplifier 71. In another embodiment, the aperture 613 can open out onto a part of the heat sink 72.

In the embodiment illustrated, the aperture 613 has a rectangular shape. In another embodiment, it is possible to envisage a square, circular, triangular, elliptical aperture or again an aperture that is bean-shaped or star-shaped. As shall be seen in detail here below, the slot enables the heat released by the heat sink 72 to be discharged by convection out of the printed circuit 500 (i.e. out of the metal structure 61).

As illustrated, the device 600 of an embodiment of the invention comprises first 614, second 615, third 616 and fourth 617 heat connectors. The connectors are made out of a metal material with low thermal resistance. They therefore take part in the electromagnetic shielding of the printed circuit 500. Each connector has a first end E1 fixedly joined to the metal plate 611 and a second end E2 fixedly joined (for example by means of a solder) to the front face 51 of the printed circuit 500 in the vicinity of the heat sink 72. As shall be seen in detail here below, the connectors form thermal bridges between the heat sink 72 and the metal plate 611. An embodiment of the invention therefore enables the use of the surface of the metal plate 611 to discharge the heat released by the heat sink 72 by radiation towards the exterior of the printed circuit 500 (i.e. out of the metal structure 61). It can be noted that this phenomenon of radiation can be advantageously accentuated if the second end E2 of each connector is fixedly joined directly to the heat sink 72. In the example shown, the first thermal connector 614 coincides with a portion of the wall 612b of the metal structure 61. This first connector 614 thus provides for a speedy and efficient discharge of the heat released by the heat sink 72 through the metal plate 611.

Figure 5:
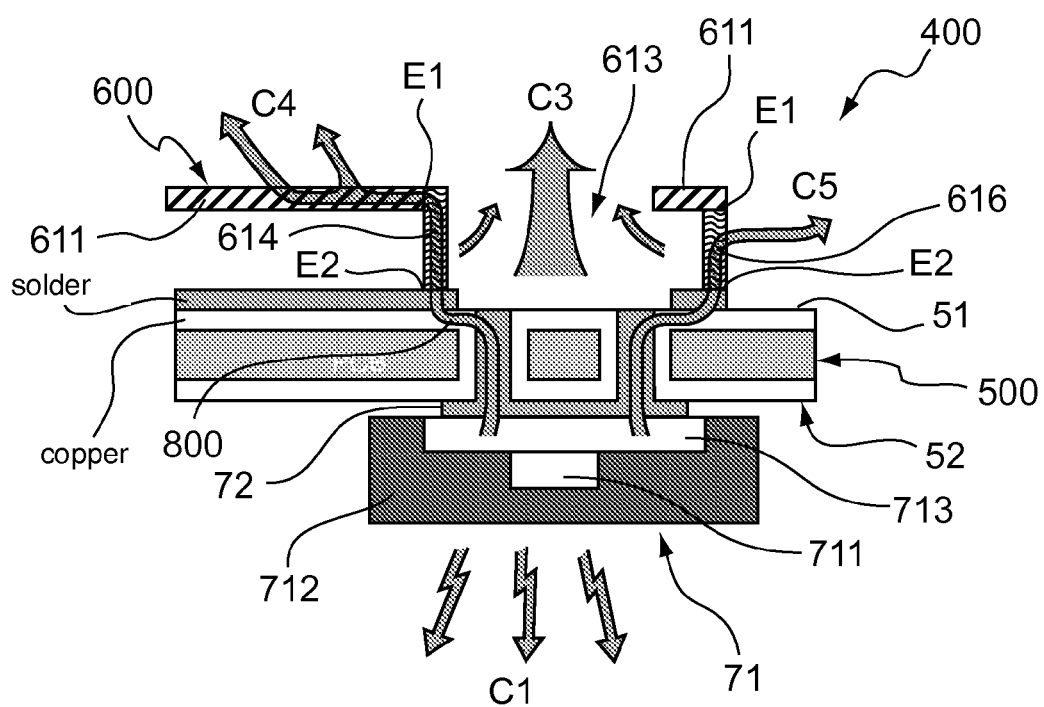
FIG. 5 presents a partial schematic section of the electronic circuit of FIG. 4.

FIG. 5 is a partial schematic sectional view of the electronic circuit 400 of FIG. 4. In this exemplary embodiment, the power amplifier 71 is mounted on the rear face 52 of the printed circuit 500. The power amplifier 71 has amplifier means 711 encapsulated in a package 712 made out of molded plastic. The package 712 has a metal sole 713 having a first face designed to receive the amplifier means 711 and a second face designed to be fixedly joined to the heat sink 72. Conventionally, the package 712 of the amplifier 71 is used to dissipate a part of the heat released by the amplifier means 711. This heat C1 is therefore radiated to the rear face 52 side of the printed circuit 500.

As illustrated, the heat sink 72 crosses the rear face 52 of the printed circuit 500 and emerges on the front face 51 of the printed circuit 500. Conventionally, the heat sink 72 collects a part of the heat released by the amplifier means 711 through the metal sole 713.

According to an embodiment of the invention, the heat released by the heat sink 72 is discharged by convection and by radiation. Indeed, a part of the heat C3 released by the heat sink 72 is discharged through the aperture 613 by natural convection. It can be noted that the thermal connectors 614, 615, 616 and 617 define a discharge channel 800 used to guide the heat C3 towards the aperture 613. This discharge channel 800 thus maximizes the convection phenomenon.

The thermal connectors 614, 615, 616 and 617 are used to collect a part of the heat C4 released by the heat sink 72 and then convey it to the metal plate 611 which then takes charge of radiating it. It can be noted that the connectors themselves radiate a part of the heat C5 released by the heat sink 72.

Figure 6A:
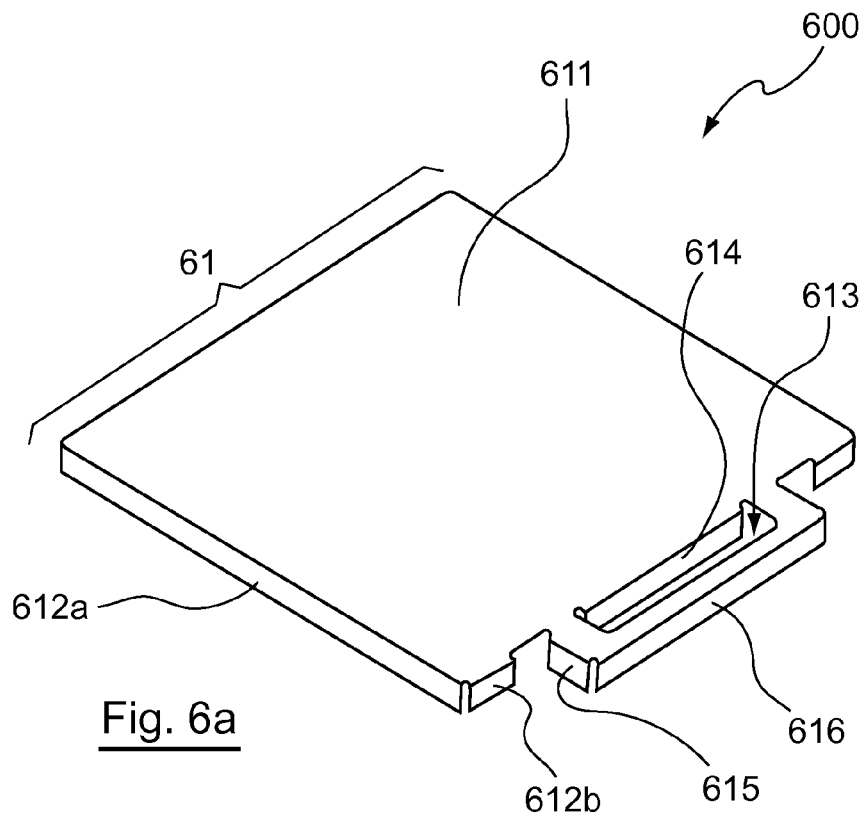
FIGS. 6a and 6b illustrate a first embodiment of the device for electromagnetic shielding and heat dissipation.
Figure 6B:
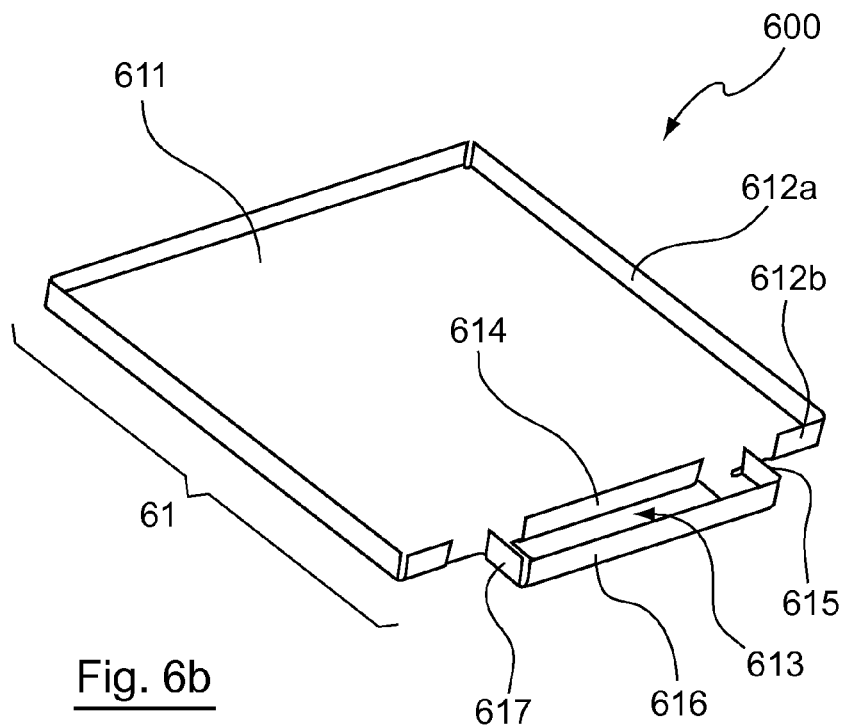

FIGS. 6a and 6b illustrate a first embodiment of the device 600 for electromagnetic shielding and dissipating heat. FIG. 6a is a view in perspective of the front face of the device 600 (i.e., the face on the ambient air side) and FIG. 6b is a view in perspective of the rear face of the device 600 (i.e., the face on the printed circuit side). In this first embodiment, the device 600 is made out of a single block. The metal wall 612a and 612b and the thermal connectors 614, 615, 616 and 617 are obtained by operations for folding the metal plate 611.

In another embodiment, the walls and thermal connectors can be elements distinct and independent of the metal plate 611. In this case, these elements may for example be soldered or screwed onto the metal plate 611 to form the metal structure 61 of an embodiment of the invention.

Figure 7A:
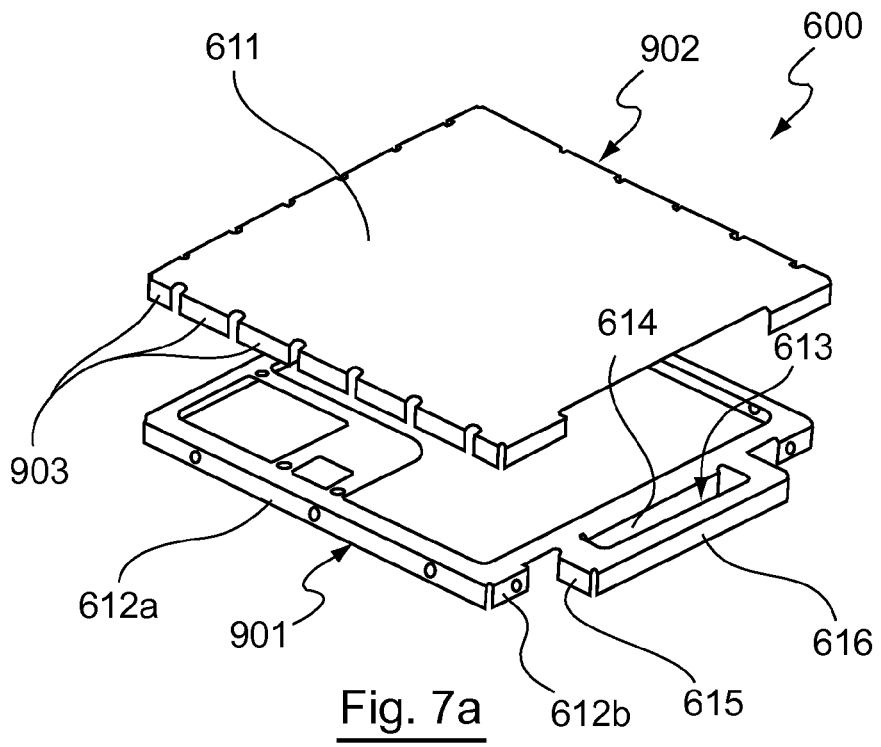
FIGS. 7a and 7b illustrate a second embodiment of the device for electromagnetic shielding and heat dissipation.
Figure 7B:
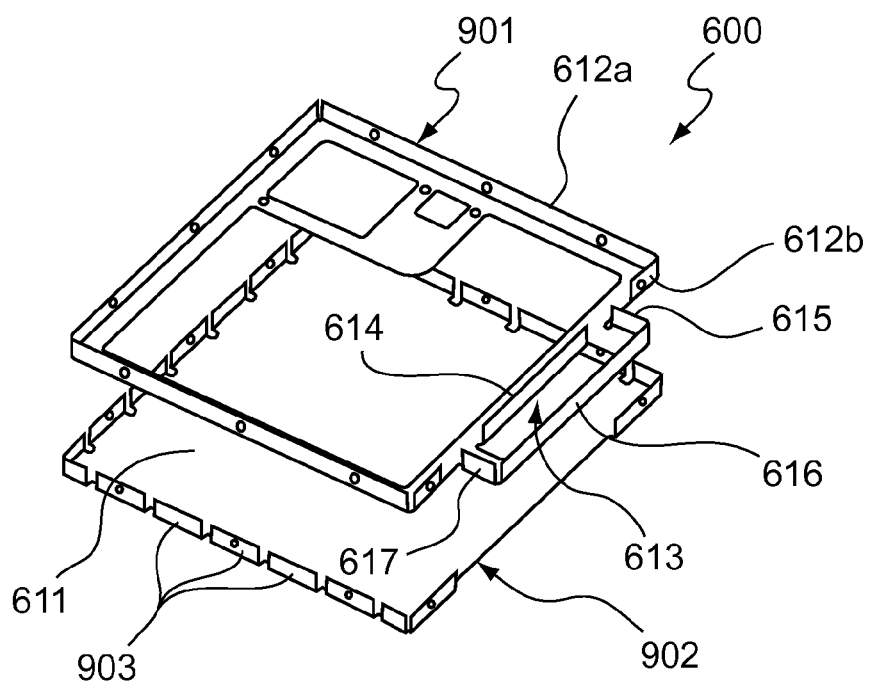

The FIGS. 7a and (front face) and 7b (rear face) illustrate a second embodiment of the device 600 for electromagnetic shielding and heat dissipation. In this second embodiment, the device 600 is made out of two blocks. More specifically, the device 600 has a belt 901 including the metal walls 612a and 612b, the thermal connectors 614, 615, 616 and 617, and the aperture 613. The device 600 furthermore has a cover 902 comprising the metal plate 611 and the hooking means 903 designed to get engaged with the metal wall 612a and 612b of the belt 901.

Figure 8A:
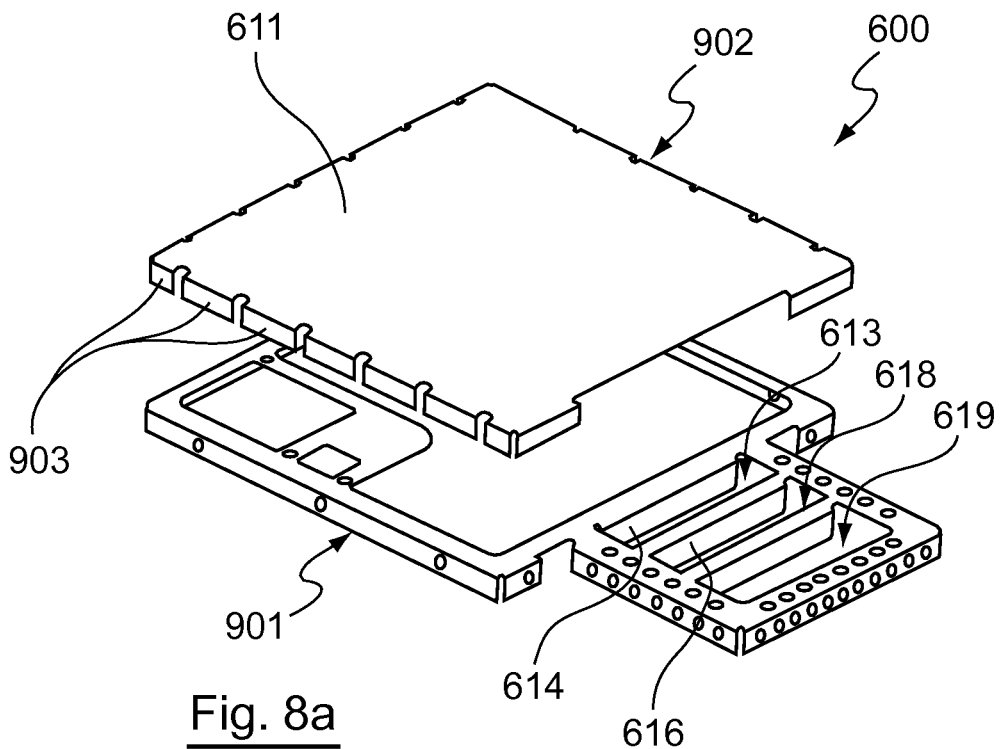
FIGS. 8a and 8b illustrate a third embodiment of the device for electromagnetic shielding and heat dissipation.
Figure 8B:
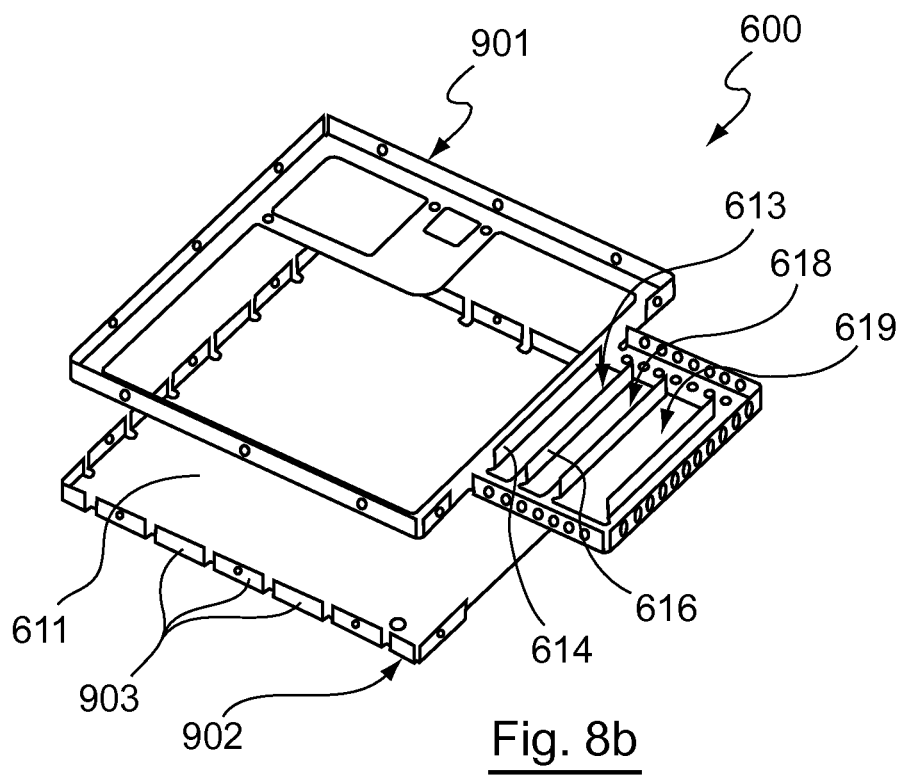

The FIGS. 8a (front face) and 8b (rear face) illustrate a third embodiment of the device 600 for electromagnetic shielding and heat dissipation. In this third embodiment, the belt 901 has apertures 618 and 619 (here below also called second aperture) situated in the vicinity of the aperture 613. The apertures 618 and 619 communicate with each other and with the aperture 613. Thus, it is possible to increase the areas of exchange with the ambient air while at the same time increasing the electromagnetic protection potential of the electronic circuit.

An embodiment of the disclosure provides a technique of heat dissipation that is efficient and simple to implement.

An embodiment provides a technique of this kind that eliminates or at least restricts the glasshouse effect caused by the shielding.

An embodiment provides a technique of this kind that does not entail an increase in the surface area of the printed circuit.

An embodiment proposes a technique of this kind that is especially well suited to the power amplifiers used in third generation (3G) radio communications devices.

An embodiment provides a technique of this kind that costs little and is compatible with all electronic components that release heat.

Although the present disclosure has been described with reference to one or more examples, workers skilled in the art will recognize that changes may be made in form and detail without departing from the scope of the disclosure and/or the appended claims.

The invention claimed is:

1. A device for electromagnetic shielding and for dissipating heat released by an electronic component, said component comprising a package designed to be fixedly joined to a first face of a printed circuit, called a rear face, by a heat sink, said heat sink going through the rear face of the printed circuit and emerging on a second face of the printed circuit, called a front face, wherein said device comprises:
   a metal or metalized structure mounted on the front face of the printed circuit and defining an electromagnetic shielding enclosure, said metal or metalized structure comprising a first aperture for discharging heat and extending appreciably so as to be facing said heat sink; and
   at least one thermal connector, a first end of which is fixedly joined to said metal or metalized structure and a second end of which is fixedly joined to at least one of said heat sink or the front face of the printed circuit in a vicinity of said heat sink.

2. The device according to claim 1, wherein the device comprises an element forming a channel for discharging heat from said heat sink to said first aperture.

3. The device according to claim 2, wherein said element forming a discharge channel includes said connector or at least one of a plurality of the connectors.

4. The device according to claim 1, wherein each connector is made out of a metallic material.

5. The device according to claim 1, wherein said structure comprises at least one second aperture situated in a vicinity of said first aperture.

6. The device according to claim 1, wherein said component comprises a power amplifier.

7. An electronic circuit comprising:
   a printed circuit comprising an electronic component, which releases heat, said component comprising a package fixedly joined to a first face of the printed circuit, called a rear face, by a heat sink, said heat sink going through the rear face of the printed circuit and emerging on a second face of the printed circuit, called a front face; and
   a device comprising:
      a metal or metalized structure mounted on the front face of the printed circuit and defining an electromagnetic shielding enclosure, said metal or metalized structure comprising a first aperture for discharging heat and extending appreciably so as to be facing said heat sink; and
      at least one thermal connector, a first end of which is fixedly joined to said metal or metalized structure and a second end of which is fixedly joined to at least one of said heat sink or the front face of the printed circuit in a vicinity of said heat sink.

8. The electronic circuit according to claim 7, wherein the device comprises an element forming a channel for discharging heat from said heat sink to said first aperture.

9. The electronic circuit according to claim 8, wherein said element forming a discharge channel includes said connector or at least one of a plurality of the connectors.

10. The electronic circuit according to claim 7, wherein each connector is made out of a metallic material.

11. The electronic circuit according to claim 7, wherein said structure comprises at least one second aperture situated in a vicinity of said first aperture.

12. The electronic circuit according to claim 7, wherein said component comprises a power amplifier.

* * * * *

UNITED STATES PATENT AND TRADEMARK OFFICE
CERTIFICATE OF CORRECTION

PATENT NO.      : 8,422,234 B2              Page 1 of 1
APPLICATION NO. : 13/056833
DATED           : April 16, 2013
INVENTOR(S)     : Goriaux et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 250 days.

Signed and Sealed this
Eighth Day of September, 2015

Michelle K. Lee
*Director of the United States Patent and Trademark Office*